United States Patent [19]

Planchard et al.

[11] Patent Number: 4,906,266

[45] Date of Patent: Mar. 6, 1990

[54] REPLACEMENT METHOD AND APPARATUS FOR A CRYOGENIC REFRIGERATION UNIT

[75] Inventors: David C. Planchard, Shrewsbury; Paul D. Lanoue, Ocean Bluff, both of Mass.

[73] Assignee: Helix Technology Corporation, Waltham, Mass.

[21] Appl. No.: 287,074

[22] Filed: Dec. 20, 1988

[51] Int. Cl.$^4$ .............................................. F25B 9/00
[52] U.S. Cl. .......................................... 62/6; 62/298; 62/303; 165/95
[58] Field of Search ................ 62/6, 298, 303; 165/95

[56] References Cited

U.S. PATENT DOCUMENTS

| | | | |
|---|---|---|---|
| 4,223,540 | 9/1980 | Lonesworth | 62/298 |
| 4,279,127 | 7/1981 | Lonesworth | 62/298 |
| 4,667,486 | 5/1987 | Miller et al. | 62/298 |
| 4,667,487 | 5/1987 | Miller et al. | 62/298 |
| 4,761,963 | 8/1988 | Kiese | 62/6 |

Primary Examiner—Ronald C. Capossela

Attorney, Agent, or Firm—Hamilton, Brook, Smith & Reynolds

[57] ABSTRACT

When a refrigerator unit is removed, inner surfaces of a refrigeration unit housing extending into a cryogenically cooled system are heated. The method is performed in such a way as to prevent the external atmosphere from coming in contact with the housing inner surfaces, thus avoiding the problem of ice formation within the housing. A heat gun is used in conjunction with an apparatus which fits into the housing and distributes heated gas, such as nitrogen, from the heat gun to different parts of the housing in relative quantities. The inner surfaces are brought to the same temperature in the same time allowing the housing to be cleaned before the refrigeration unit is replaced. The apparatus guiding the heated gas is mounted on the outside of the housing and includes stops on its supports to keep the apparatus from making contact with the inner surfaces of the housing. Spring loaded temperature sensors attach to the apparatus at different points and make contact with the inner end surfaces of the housing, allowing the housing temperature to be monitored during the heating process.

24 Claims, 3 Drawing Sheets

REPLACEMENT METHOD AND APPARATUS FOR A CRYOGENIC REFRIGERATION UNIT

BACKGROUND OF THE INVENTION

Many cryogenic systems, including magnetic resonance imaging systems, use a cryogenic refrigeration unit to maintain minimal helium boiloff from a liquid helium bath. A refrigeration unit often may extend into a housing which extends into the chamber containing the liquid helium bath. The refrigerator keeps radiation shields within the housing at a relatively low temperature to minimize the temperature gradient about the liquid helium chamber.

Occasionally, it is necessary to remove the refrigeration unit for repair or cleaning purposes. Since the housing is usually at cryogenic temperatures, to remove the refrigeration unit and expose the housing to an uncontrolled atmosphere would result in a rapid formation of ice within the housing as water vapor comes in contact with the housing walls. This then restricts or prevents the replacement of the removed unit. Such a freeze-up can also cause thermal expansion of joints in the housing. One approach to overcoming the freeze-up problem has been to cover the refrigerator with a tent purged with nitrogen before removal of the unit but such an approach is cumbersome. Hot air guns have also been suggested for removing the ice but have not proven successful.

SUMMARY OF THE INVENTION

The present invention provides a method for replacing a refrigeration unit in a cryogenically cooled system while preventing water vapor from freezing on the inside of the refrigeration unit housing. After removing the refrigeration unit from the housing, the inner surfaces of the housing are heated and a clean purging gas of low condensation temperature, such as helium or nitrogen, is forced into the housing. It is necessary that the condensation temperature of the gas is below 190K, and preferred that is is below 100K. Nitrogen, with a condensation temperature of 77K is preferred over helium due to its lower cost.

If the housing is a two-stage housing, one stage being colder than the other, the two stages are heated at different rates so they reach a desired temperature at the same time. Temperature sensors located in the different stages provide the necessary monitoring of the heating process. Once the inside of the housing is heated to the desired temperature, the housing inner surfaces may be cleaned.

To combine the heating and purging processes, the purging gas forced into the chamber is heated and used to heat the housing inner surfaces. An apparatus is provided to force the heated gas into the refrigerator housing. One implementation fits in a two-stage housing and is designed to deliver predetermined relative quantities of the heated gas to the end surfaces of the different stage.. This implementation includes temperature sensors on the apparatus which monitor the temperature of the housing inner end surfaces. Spring loading of the sensors ensures that both make contact with the housing.

An apparatus capable of forcing heated gas into a two-stage refrigerator housing includes two concentric cylinders attached to a pressurized source of heated gas. The two cylinders fit in the housing, the smaller radius cylinder extending into a stage of the housing further from the housing opening than the other stage. The larger cylinder may partially enclose the smaller cylinder as they both receive gas directly from the pressurized heated gas source. The cylinders conduct the pressurized heated gas in relative quantities to the different stages. Temperature sensors provided are attached to the ends of the cylinders so they make contact with the inner end surfaces of the two stages of the housing.

The apparatus includes supporting means which come in contact with the outside of the refrigerator housing. The supporting means include spacers to keep the apparatus positioned away from the inner end surfaces of the housing, allowing return gas flow passage around the apparatus. Reference marks on the outer surface of the refrigerator unit housing allow the apparatus to be aligned correctly within the housing.

PREFERRED EMBODIMENT OF THE INVENTION

Figure 1:
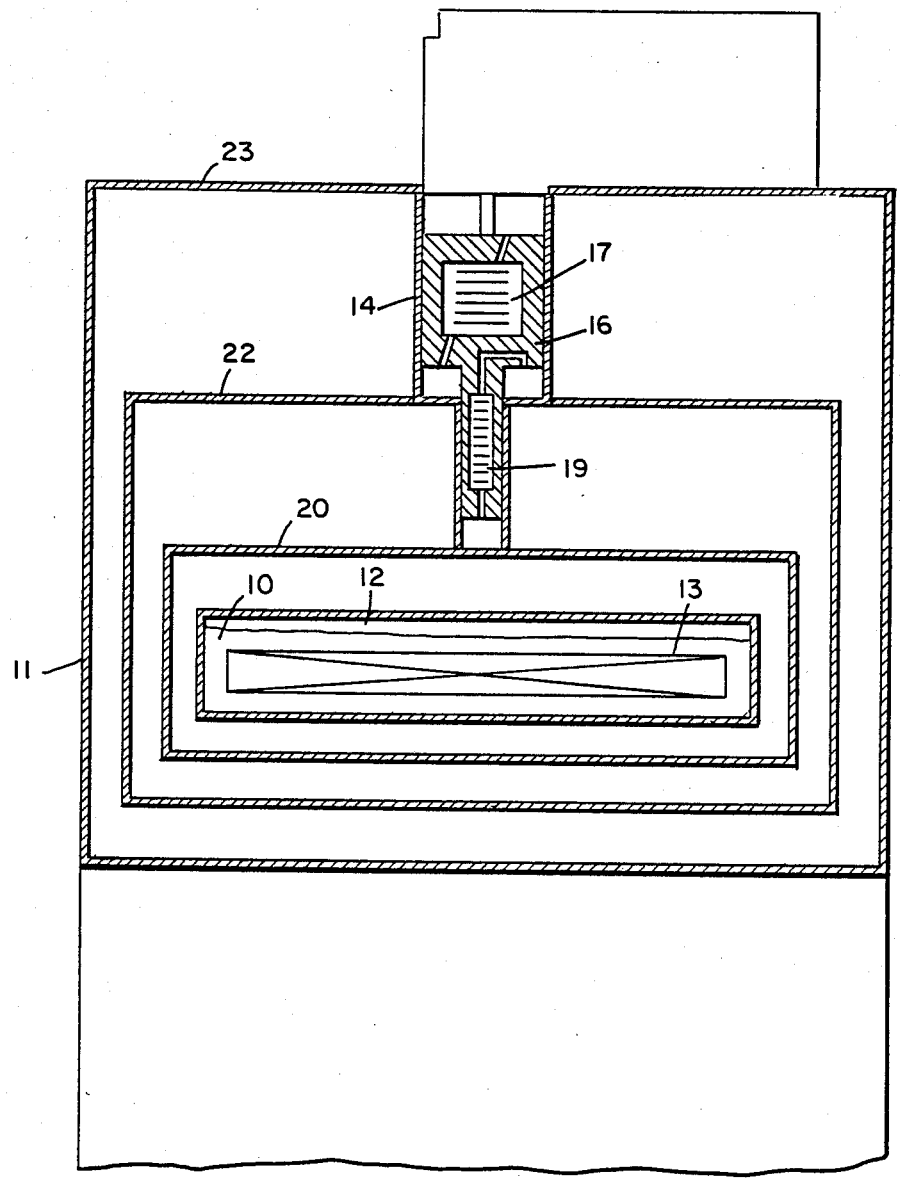
FIG. 1 is a cross sectional view of a cryogenically cooled system with the refrigeration unit in place.

FIG. 1 shows a magnetic resonance imaging (MRI) unit. The cryogenically cooled system includes a liquid helium bath 10 which keeps the contents of the chamber 12, in this case a magnetic coil 13, in which it is stored at approximately 4.2 K. Such a system is contained within an annular shaped vacuum jacketed structure 11. The subject (a person) to be viewed by the MRI system is placed in the center of the annular structure 11. As the MRI system is used the magnet 13 is supercooled in the bath of liquid helium 10 retained in chamber 12.

A gradual boiloff of the liquid helium occurs as heat is transferred from the magnetic coil 13. The helium boiloff in chamber 12 is kept at a minimum by cooling the surroundings with a conventional Gifford-Macmahon refrigerator in a two stage housing 14. The refrigerator extends toward the chamber 12, and houses a displacer unit 16 which moves with reciprocating motion to displace refrigerant gas in the housing 14. As the displacer 16 moves down, the cold gas in the lower portion of each stage of the housing is displaced to the top of the housing, and cools regenerative matrices 17 and 19 in the displacer. Pressurized gas, usually helium, is then valved into the housing. When the housing 14 has filled with pressurized gas, the displacer 16 moves up, forcing the gas to the lower portions of the housing and cooling the gas from the regenerative matrix. The thus cooled gas at the lower ends of the two stages is then further cooled as a valve is opened at the upper end and the gas is expanded. The cycle then repeats.

The radiation shields 20, 22, 23 serve to minimize radiation heat loss from the bath. The second stage shield 20 is aligned with the end surface of the second stage of the housing. This end surface maintains a temperature of approximately 10 K. The first stage shield 22 is aligned with the end surface of the first stage of the housing. This end shield maintains a temperature of approximately 70 K.

On occasion, the displacer unit 16 must be removed from the housing 14 for repair or cleaning. The displacer unit 16 may also freeze in the housing periodically due to a buildup of contaminents on the housing inner surface, thus necessitating removal. Removal of the displacer unit 16 often means that the housing is then exposed to an uncontrolled atmosphere. If this is the case, the housing 14, still being at cryogenic temperatures, freezes any water vapor which comes in contact with it. A rapid formation of ice follows, making replacement of the displacer unit 16 impossible. On the other hand, quenching the system of liquid helium to warm the system is not a practical solution.

One object of the present invention is to provide a means of heating the inner surfaces of the housing 14 so that exposure to the atmosphere does not cause a formation of ice. To accomplish this efficiently a number of steps are followed. First, a clean purging gas of low condensation temperature and low moisture content, such as nitrogen, is forced into the housing 14 while the displacer unit 16 is removed. This fills the space in the housing 14, preventing the ambient atmosphere from making contact with the housing inner surfaces. The gas may freeze on the inner surface of the housing but, because it is relatively clean of water vapor and is of a much lower condensation temperature than water vapor, it can be more easily removed with heating in a subsequent step. To be an effective purge, the gas has a condensation temperature below 190K, although it is preferred that the condensation temperature is below 100K. Nitrogen has a condensation temperature of 77K and is relatively inexpensive, making it a good choice for a purging gas.

Figure 2:
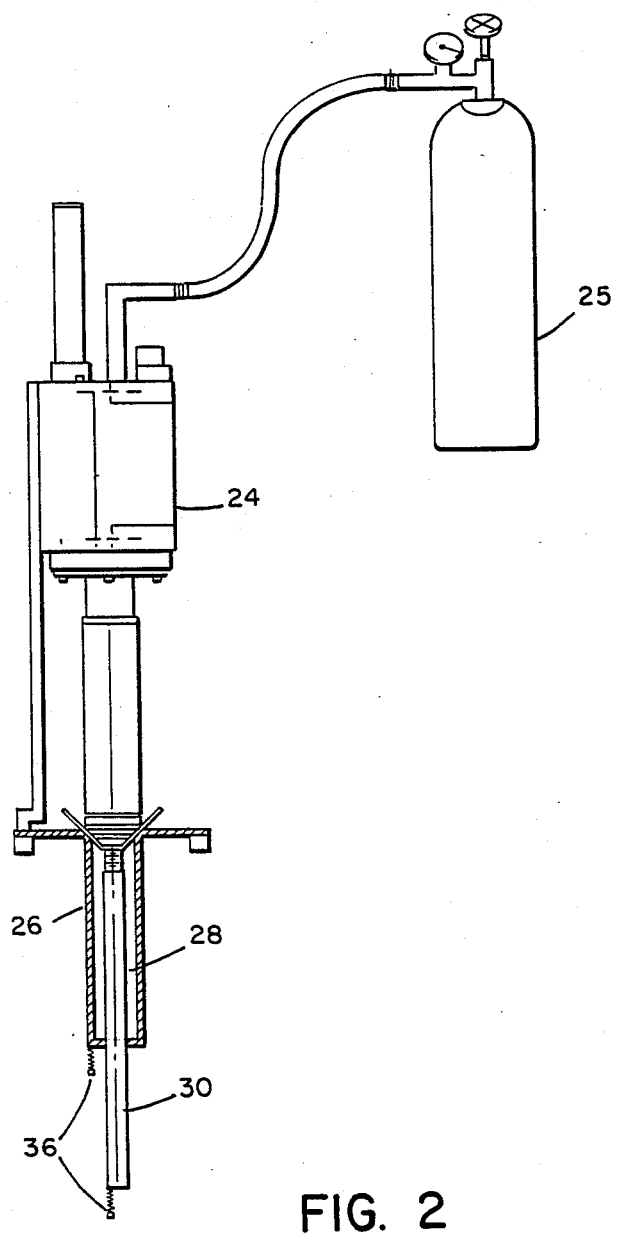
FIG. 2 shows an apparatus for heating a chamber in a cryogenically cooled system.

FIG. 2 shows a guiding apparatus 26 which conducts heated gas from a heat gun 24 into the housing 14. This gas i of low condensation temperature and is usually nitrogen. The heat gun is attached to the top of the apparatus 26 and the pressurized gas originating in a gas tank 25 is forced into the two cylindrical chambers 28, 30 of the apparatus 26.

Figure 3:
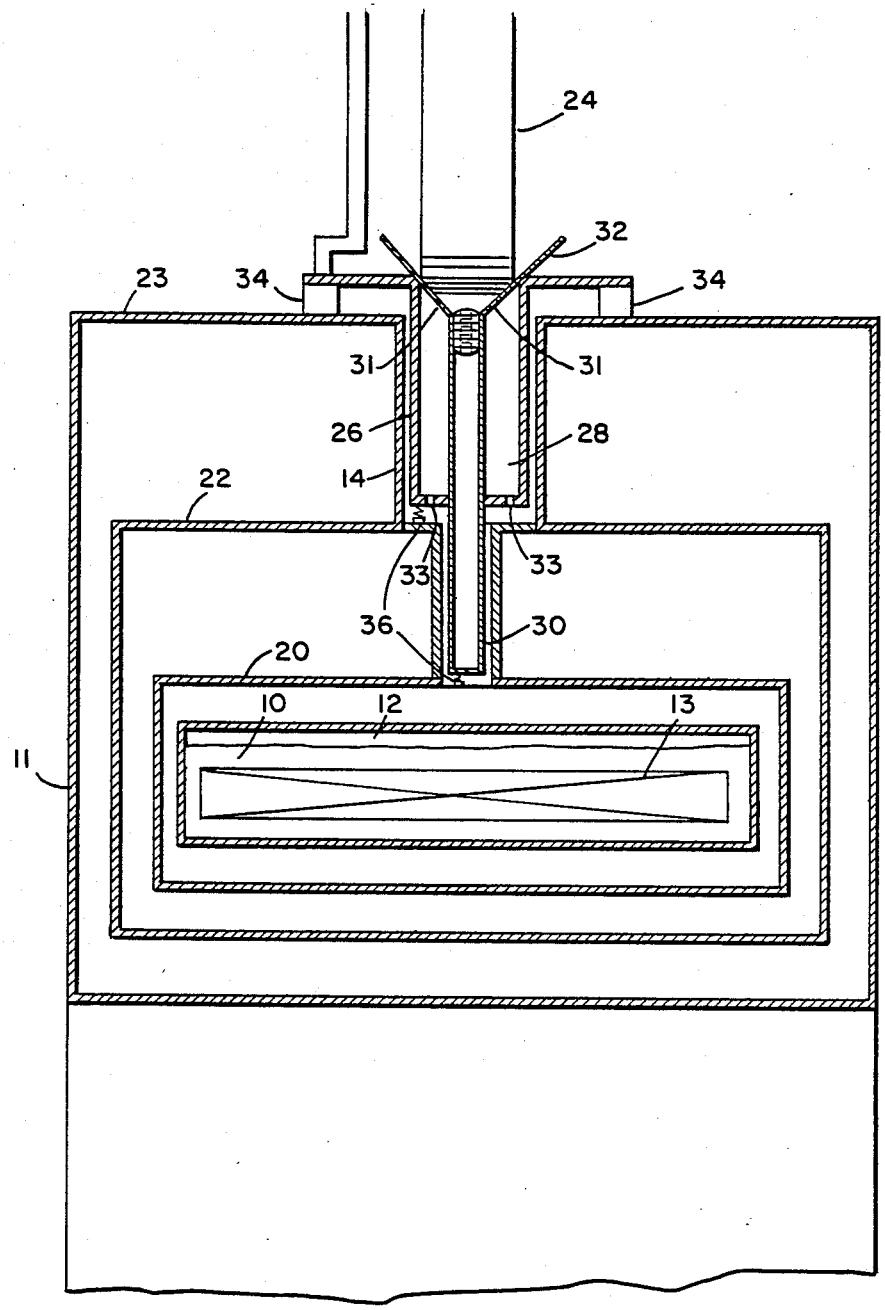
FIG. 3 is a cross sectional view of a cryogenically cooled system with a heating unit in place.

FIG. 3 shows the apparatus 26 in the housing 14 with a cut away view of the heat gun 24. Because the different stages of the housing are at different temperatures, the orifices 31 in the conical section 32 of the apparatus 26 and the orifices 33 in the bottom of the larger cylindrical chamber 28 are sized to allow the heated gas to be distributed to the different stages in certain relative quantities. For maximum efficiency, the temperature of the two stages should be raised to the desired maximum in the same amount of time. Since the second stage is colder than the first stage, a larger quantity of heated gas is delivered to the second stage through the smaller chamber 30.

The gas flows from a pressurized tank through the heat gun 24 which heats it to about 300° C. With approximately 65% of the gas going through the smaller chamber 30 and 35% going through the larger chamber 28, both stages can be brought to a temperature of about 55°-65° C. in about two to three minutes. Once the desired temperature is achieved, the heat gun 24 and guiding apparatus 26 are removed from the housing 14 and the nitrogen purging gas is replaced. The inner surfaces of the housing are then quickly cleaned and the displacer unit 16 is replaced before the surfaces cool to 77.36 K, the condensation temperature of nitrogen. Typically, the displacer must be replaced within 15 to 20 seconds of removal of the heat source.

To keep the guiding apparatus 26 from making direct contact with the housing 14, stops 34 are attached to the supporting arms of the apparatus 26. These stops are sized to keep the apparatus 26 positioned away from the end surfaces of the housing, providing return flow for the pressurized gas about the cylinders 28 and 30. The stops are made to line up with reference marks on the outside of the housing 14 to keep the apparatus 26 centered.

Since the end surfaces of the housing (those coupled to the radiation shields) are the coldest points in each stage, temperature sensors 36 are attached to the end of each chamber 28, 30 of the apparatus. This allows the temperature to be monitored as the housing is heated. The temperature sensors 36 are spring-loaded and sized so they make contact with the inner end surfaces of the housing 14.

We claim:

1. A method of replacing a refrigeration unit, wherein the refrigeration unit resides in a housing extending into a cryogenically cooled system which maintains cryogenic temperatures about the housing during removal of the refrigeration unit, the method comprising:
   removing the refrigeration unit from the housing;
   heating inner surfaces of the housing and forcing gas of low condensation temperature into the housing; and
   replacing the refrigeration unit in the housing.

2. The method of claim 1 wherein said gas has a condensation temperature below 190 Kelvin.

3. The method of claim 1 wherein said gas is substantially moisture free.

4. The method of claim 1 wherein said gas is helium.

5. The method of claim 1 wherein said gas is nitrogen.

6. The method of claim 1 wherein the inner surfaces of the housing are heated by heating gas of low condensation temperature which is forced into the housing.

7. The method of claim 6 wherein said gas is Nitrogen.

8. The method of claim 6 wherein said gas is substantially moisture free.

9. The method of claim 1 wherein the inner surfaces of the housing are cleaned while the refrigeration unit is removed from the housing.

10. The method of claim 1 wherein the housing comprises first and second axially-aligned cylindrical chambers of different radii, the second chamber being further from the opening of the housing than the first chamber, and a second chamber inner end surface being at a colder temperature than an inner end surface of the first chamber.

11. The method of claim 10 wherein said gas forced into the housing is heated and forced through an apparatus which fits into the housing and delivers predetermined relative quantities of the gas to the end surfaces of the housing.

12. The method of claim 11 wherein about thirty-five percent of said heated gas is delivered to said first chamber inner end surfaces and about sixty-five percent of said heated gas is delivered to said second chamber inner end surface.

13. The method of claim 11 wherein temperature sensors are located at inner end surfaces of the chambers to monitor the temperature of said inner end surfaces.

14. The method of claim 1 wherein gas of low condensation temperature is forced into the housing both before and after the inner surfaces of the housing are heated.

15. The method of claim 14 wherein the inner surfaces of said housing are heated by heating gas of low condensation temperature which is forced into the housing.

16. The method of claim 14 wherein said gas is substantially moisture free.

17. The method of claim 14 wherein said gas is nitrogen.

18. A method of replacing a refrigeration unit, wherein the refrigeration unit resides in a housing of first and second axially-aligned cylindrical chambers of different radii extending into a cryogenically cooled system, the second chamber being further from the opening of the housing than the first chamber, and a second chamber inner end surface being at a colder temperature than an inner end surface of the first chamber, cryogenic temperatures being maintained about the housing by the cryogenically cooled system during removal of the refrigeration unit, the method comprising:

removing the refrigeration unit from the housing;
   heating inner surfaces of the housing by forcing heated gas into the housing through an apparatus which fits in the housing and delivers predetermined relative quantities of the heated gas to the end surfaces of the housing; and
   replacing the refrigeration unit in the housing.

19. The method of claim 18 wherein said method includes monitoring the temperature of said inner end surfaces with temperature sensors.

20. The method of claim 19 wherein said method includes attaching said temperature sensors to said apparatus which fits in the housing and delivers predetermined relative quantities of said heated gas to the end surfaces of the housing.

21. The method of claim 20 wherein said temperature monitoring is with spring loaded temperature sensors.

22. The method of claim 18 wherein said heating of inner surfaces is by forcing a heated gas of low condensation temperature into the housing through an apparatus which fits in the housing and delivers predetermined relative quantities of the heated gas to the end sufaces of the housing.

23. The method of claim 22 wherein said heated gas is substantially moisture free.

24. A method of replacing a refrigeration unit, wherein the refrigeration unit resides in a housing of first and second axially-aligned cylindrical chambers of different radii extending into a cryogenically cooled system, the second chamber being further from the opening of the housing than the first chamber, and a second chamber inner end surface being at a colder temperature than an inner end surface of the first chamber, cryogenic temperatures being maintained about the housing by the cryogenically cooled system during removal of the refrigeration unit, the method comprising:

removing the refrigeration unit from the housing;
   inserting, into said housing, a purging gas of low condensation temperature;
   heating inner surfaces of the housing by forcing heated gas of low condensation temperature into the housing through an apparatus which fits in the housing and delivers predetermined relative quantities of the heated gas to the end surfaces of the housing;
   reinserting, into the housing, a purging gas of low condensation temperature;
   cleaning the inner surfaces of the housing; and
   replacing the refrigeration unit in the housing.

* * * * *